United States Patent [19]

Gramas

[11] 3,784,378

[45] Jan. 8, 1974

[54] DOUBLE-EXPOSURE METHOD FOR PRODUCING REVERSE IMAGES IN PHOTOPOLYMERS

[75] Inventor: John Vincent Gramas, Middletown, N.J.

[73] Assignee: E. I. du Pont de Nemours and Company, Wilmington, Del.

[22] Filed: Oct. 18, 1971

[21] Appl. No.: 189,835

[52] U.S. Cl. .................. 96/27 E, 96/48 R, 96/115 P
[51] Int. Cl. ............................ G03c 5/04, G03c 5/24
[58] Field of Search ................. 96/35.1, 27 E, 48 R, 96/115 P, 28, 33, 48 HD

[56] References Cited

UNITED STATES PATENTS 3,380,825 4/1968 Webers ................................ 96/35.1
3,144,331 8/1964 Thommes ............................. 96/27

*Primary Examiner*—J. Travis Brown
*Assistant Examiner*—Won H. Louie, Jr.
*Attorney*—William R. Moser

[57] ABSTRACT

For the production of reverse images, a photosensitive element comprising a polymerizable (or crosslinkable) material and two photoinitiators responsive to different wavelengths of actinic radiation is exposed successively to actinic radiation of wavelengths appropriate for the two photoinitiators. The first exposure is imagewise and the second is nonimagewise. A polymerization inhibitor is present during both exposures. The method is useful in the graphic arts where a positive-working system is required, e.g., for relief or planographic printing plates, direct positive copying films, and the like.

11 Claims, No Drawings

DOUBLE-EXPOSURE METHOD FOR PRODUCING REVERSE IMAGES IN PHOTOPOLYMERS

DESCRIPTION OF PRIOR ART

The present invention is an improved process for forming a reverse image in a photohardenable layer similar in some respects to the process described in U.S. Pat. No. 3,380,825 to Webers. The process of that patent involves a first imagewise exposure under such conditions that a gaseous polymerization inhibitor exhausts the photoinitiator that has been excited by actinic radiation in the exposed areas without any substantial polymerization having occurred. The photosensitive layer must then be shielded from the gaseous inhibitor during a second, nonimagewise exposure to the same actinic radiation. Thus, polymerization can occur only in those areas where the photoinitiator was not exhausted in the first, imagewise exposure; i.e., polymerization or hardening occurs in the areas that correspond to the dark or opaque areas of the original, and a "reverse" image that is a true copy of the original is produced in the photosensitive layer. When carefully carried out, the process of the patent is capable of producing reverse images of excellent quality, but the process involves careful and inconvenient manipulations that affect its practicality and economic attractiveness. Foremost among these is the necessity to interrupt the process to preclude the presence of the gaseous inhibitor during the second, nonimagewise exposure step. This is usually accomplished by overlaying the photosensitive element with a sheet of film that is transparent to the actinic radiation employed but impervious to the gaseous inhibitor. If this step is not carefully performed, final image quality will suffer because the desired polymerization will not occur at all or will occur erratically in the second exposure step because of the presence of non-excluded inhibitor. The requirement to interrupt the process for the careful installation of the barrier layer naturally adds to the cost of the copies made by the process. The need exists, therefore, for a simpler, more certain and less expensive approach to make reverse images in photosensitive layers or elements employing photohardenable or photopolymerizable compositions.

SUMMARY OF THE INVENTION

The invention relates to a process for producing a reverse image in a photohardenable layer comprising 1. imagewise exposing said layer, in the presence of a photohardening inhibitor, to radiation of wavelengths at which said inhibitor prevents photohardening of the layer, said step of exposing being carried out until the exposed areas of the layer are not capable of being photopolymerized by further exposure to radiation, and
2. nonimagewise exposing said layer to radiation, said radiation including wavelengths different than those of the radiation used in the step of imagewise exposing and capable of photohardening, in the presence of said inhibitor, the areas that were not exposed in the imagewise exposure.

This process provides a great improvement over the prior art, since images of excellent quality are obtained without the necessity of excluding inhibitor during the nonimagewise exposure. This change leads to lower costs because of reduced handling, and removes a significant source of variability in image quality.

DESCRIPTION OF PREFERRED EMBODIMENTS

The process of the invention comprises imagewise exposing a photohardenable layer or element to radiation in the presence of a material, termed a "photohardening inhibitor," which prevents the radiation from photohardening the layer. This exposure in the presence of inhibitor destroys the photosensitivity of the exposed areas so that they will not be photohardened by subsequent exposure to radiation. Thereafter, all of the layer is exposed to radiation, i.e., is "nonimagewise" exposed, which results in the photohardening of the areas that were not exposed in the step of imagewise exposure. In contradistinction distinction to the prior art, this second exposure may be carried out in the presence of inhibitor.

It is quite surprising that the process having these steps would work as described without the need for excluding inhibitor in the second exposure. One would except that since exposure of the layer in the presence of inhibitor in the first step destroys photohardenability, the inhibitor would also prevent photohardening in the second step. Surprisingly, the above process can be performed so that this does not occur. This is accomplished by a difference in the wavelengths of the radiation used for the two exposures and a difference in the reaction of the inhibitor-layer system to radiation of the different wavelengths employed, whereby the inhibitor is capable of preventing photohardening by radiation of wavelengths used in the imagewise exposure but is not capable of preventing photohardening by wavelengths used in the nonimagewise exposure.

In one embodiment of the process, the layer contains a. an ethylenically unsaturated, addition-polymerizable or crosslinkable material, b. a hydrogen-donor compound capable of initiating polymerization or crosslinking of said material, and c. first and second free radical generating compounds capable of activating said hydrogen-donor compound on exposure to radiation of different wavelengths, and the steps of the process comprise 1. imagewise exposing said layer to radiation of wavelengths at which only said first free radical generating compound is capable of activating said hydrogen-donor compound, in the presence of a gaseous polymerization inhibitor that exhausts said hydrogen-donor compound and prevents photohardening in the exposed areas, said step of imagewise exposing being carried out until the exposed areas are not capable of being polymerized by further exposure to radiation, and
2. nonimagewise exposing said layer to radiation, said radiation including wavelengths different than those of the radiation used in the step of imagewise exposing and capable of photohardening, in the presence of said inhibitor, the areas that were not exposed in the imagewise exposure, and, optionally,
3. heating said layer to complete the hardening of the areas that were not exposed in the imagewise exposure.

The mechanism by which the process works in the above-described embodiment is the depletion of the hydrogen-donor compound in the areas that are exposed during the imagewise exposure, rendering them incapable of being polymerized by further exposure to radiation. The "further exposure" referred to is that of the nonimagewise exposure, which employs radiation of wavelengths different than those of the radiation employed in the imagewise exposure. The exposed areas will normally be resistant to polymerization by radiation of any wavelength due to depletion of hydrogen-donor, although the process only requires that they be incapable of being polymerized by the further exposure of the second step.

It is preferred that radiation of wavelengths greater than 450 nanometers be used for the imagewise exposure, and that the radiation used for the nonimagewise exposure include wavelengths less than 450 nanometers. Since the hydrogen-donor compound is depleted in the exposed areas by activating it with the first ("slow") free-radical generating compound at a rate at which it can be exhausted by the inhibitor, it is essential that the radiation of the imagewise exposure not cause the second ("fast") free radical generating compound to generate free radicals at a rate which would cause polymerization. For the preferred materials, this requires that only radiation of 450 nm or higher (e.g., 480 nm) be used for imagewise exposure. Since the objective of the nonimagewise exposure is to cause hardening, the radiation can include all wavelengths so long as it includes wavelengths that activate the second free-radical generating compound (e.g., less than 450 nm). It is required that the first free radical generating compound be responsive to the radiation used in the imagewise exposure, and it is permissible, although unnecessary, that it be responsive to radiation of wavelengths used in the nonimagewise exposure.

The layer may contain, in addition to the unsaturated monomer, hydrogen-donor, and free radical generating compounds, an organic polymeric binder, a plasticizer for the binder, a thermal polymerization inhibitor, and a chain transfer agent or polymerization accelerator, all as described more fully hereinafter, and the photohardenable layer may be part of a photosensitive element including a support and a cover sheet. It is required that the layer be comprised of material that will undergo photohardening upon exposure to actinic radiation. Photohardening involves changes in various physical properties of the material, which may include: an increase in hardness, tensile strength, or viscosity; a decrease in swelling, solubility, or sensitivity to attack by solvents; and an increase in melting point or flow temperature. These effects are usually accomplished by photochemical reactions in which new chemical bonds are formed through photo-induced polymerization and/or cross-linking. Materials of this kind and their use as photosensitive layers or elements are disclosed in a number of patents, among which may be mentioned as representative U.S. Pat. Nos. 2,760,863, 2,791,504, 2,927,022, 2,951,758, 3,261,686, 3,380,831, 3,418,118, 3,418,295, 3,448,089, 3,479,185, and 3,495,987.

A preferred photohardenable layer for use in this invention comprises a photopolymerizable stratum which contains an organic polymeric binder, a polymerizable monomer, a hydrogen-donor compound, two free-radical-generating agents responsive to radiation of different wavelengths, a chain transfer agent, and a plasticizer, each so selected and used in such proportions that the resulting stratum will be solid below 40° C. It is to be understood, however, that one component may actually serve to fill two or more of the functions just named. Thus, for example, one ingredient may serve as both a hydrogen-donor compound and as a chain transfer agent. Similarly, the polymerizable monomer and the polymeric binder may be so chosen that the former serves as a plasticizer for the latter.

Another preferred composition for the layer differs from the foregoing in that the organic polymeric binder and the polymerizable monomer are replaced by a polymeric compound having extralinear radicals containing ethylenic unsaturation and capable of crosslinking with one or more adjacent polymeric chains.

For use according to the invention, by appropriate selection of the kind and proportion of binder, the preferred components outlined above may be mixed together in a suitable solvent and the resulting composition cast by conventional procedures to form, after evaporation of the solvent, a self-supporting photosensitive stratum. Alternatively, the solution of components may be coated on a base or substrate and the solvent then evaporated to leave a photosensitive stratum on the base. In still another embodiment, the binder may be omitted and the combination of the remaining components, with or without solvent, may be coated on a substrate and used in liquid, i.e., unhardened, form to carry out the process of the invention. As a matter of convenience in handling, it is generally preferred to use a binder and to employ a base or substrate, but it is to be understood that the scope of the invention is not limited to that embodiment or to the other embodiments mentioned above solely by way of illustration.

When a binder is used, it is preferred to employ an organic polymeric material that is solid at 50° C., and it is necessary that the binder be compatible with the polymerizable monomer, the polymerization initiator system, and any other components that may be present. It may frequently be desirable, but it is not required, that the binder be thermoplastic. When a binder is used, it is preferred that it constitute from about 10 to about 90 parts by weight of the total photosensitive composition (exclusive of any base or substrate that may be employed) and that the polymerizable monomer likewise constitute reciprocally from about 10 to about 90 parts by weight of the same total photosensitive composition. The binder may be of the same general type as the polymerizable monomer being used and may be soluble therein and plasticized thereby.

A wide variety of suitable binders, both thermoplastic and nonthermoplastic, is disclosed in Burg and Cohen, U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in Plambeck, U.S. Pat. Nos. 2,760,863 and 2,791,504. Still other useful binders are (a) the N-methoxymethyl polyhexamethylene adipamide mixtures of Saner, British Pat. No. 826,272; (b) the polyester, polyacetal or mixed polyesteracetal mixtures of Martin, U.S. Pat. No. 2,892,716; (c) the fusible polyvinyl alcohol derivatives of Martin, U.S. Pat. No. 2,902,365; (d) the fusible blends of selected organic-soluble, base-soluble cellulose derivatives of Martin and Barney, U.S. Pat. No. 2,927,022; (e) the polyvinyl acetal compositions having extralinear vinylidene groups of Martin, U.S. Pat. No. 2,902,710; (f) the linear polyamide compositions containing extralinear N-acrylyloxymethyl groups of Saner and Burg, U.S. Pat. No. 2,972,540; and (g) the 1,3-butadiene compositions of McGraw, U.S. Pat. No. 3,024,180.

In some instances, the polymerizable monomer may also serve as a plasticizer for the binder, when a binder is used. In other instances, it may be desirable to include a separate plasticizer component in the composition. The plasticizer can readily be selected from the large number of materials known in the art on the basis of its suitability for the particular binder material and its compatibility with the other components. In general, the plasticizers should be an inert, relatively non-volatile, liquid or semi-liquid material. Examples of suitable materials are: triacetin; triethylene glycol diacetate, dipropionate, or diisobutyrate; and bis-(acetamidopropoxy) ethane.

The instant invention is not limited to the use of any particular polymerizable monomer, it being required only that the monomer be ethylenically unsaturated and capable of addition polymerization. A large number of useful compounds is available, generally characterized by one or more terminal ethylenic groups. Among the suitable materials may be mentioned (a) various vinyl and vinylidene monomers, e.g., vinyl carboxylates, α-alkyl acrylates, α-substituted acrylic acids and esters thereof, vinyl esters, vinyl hydrocarbons, acrylic and α-substituted acrylic acid esters of the polymethylene glycols and ether alcohols, all as disclosed in Plambeck, U.S. Pat. Nos. 2,760,863 and 2,791,504; (b) the various compounds disclosed (col. 16, 11. 36 ff.) in Martin and Barney, U.S. Pat. No. 2,927,022, and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such hetero-atoms as nitrogen, oxygen and sulfur; (c) esters of pentaerythritol compounds of the kind disclosed in Celeste and Bauer, U.S. Pat. No. 3,261,686; and (d) compounds of this kind described in Cohen and Schoenthaler, U.S. Pat. No. 3,380,831, e.g., the reaction product of trimethylolpropane, ethylene oxide, and acrylic and methacrylic acids.

The polymeric binder and the polymerizable monomer can be combined in a single material serving both of these functions, in which case the required ethylenic unsaturation can be present as an extralinear substituent attached to a thermoplastic linear polymer, e.g., polyvinyl acetate/acrylate, cellulose acetate/acrylate, cellulose acetate/methacrylate, N-acrylyloxymethyl polyamide, and the like. Suitable materials of this kind are described, for example, in U.S. Pat. Nos. 3,418,295 and 3,448,089. For convenience in expression herein, the term "polymerizable monomer" is to be understood as including ethylenically unsaturated, photocrosslinkable polymeric compounds of this kind, and the term "polymerization" to include crosslinking.

The hydrogen-donor compound and the two free-radical-generating agents, all taken together, may be considered as comprising a polymerization initiator system or systems. In a given instance, these components will be chosen from among the many useful compounds known in the art on the basis of their solubility in the composition, their compatibility with the other components, their responsiveness to actinic radiations of different wavelengths, and their effectiveness in initiating polymerization of the specicic monomer chosen. Their concentrations in the composition will be governed by such factors as the intended thickness of the coating, the anticipated exposure conditions, and the desired photographic speed, i.e., rate of polymerization, all as well known to those skilled in the art.

The hydrogen-donor component of the composition is a compound which has a reactive atom, usually hydrogen, which is removable to yield a radical that will react with the ethylenically unsaturated monomer to initiate growth of polymer chains, or with the ethylenically unsaturated polymeric compound to initiate crosslinking. Some of these materials are also sometimes referred to as electron-donor agents. In the practice of the present invention, it is important that the hydrogen-donor compound should not itself be activatable by actinic radiation to produce free-radicals that will initiate polymerization, but that it be reactive to different degress with the two other free-radical-producing agents that are responsive to actinic radiation of different wavelengths, as defined more fully hereinafter.

Particularly useful and preferred hydrogen-donor compounds are described in Thommes & Walker U.S. Pat. No. 3,418,118 and in Chambers U.S. Pat. No. 3,479,185. Among the suitable classes of compounds are amines, including secondary and tertiary amines, and especially the aromatic tertiary amines having at least one $CH_2$ group adjacent to the nitrogen atom; amine-substituted leuco dyes, especially those having at least one dialkylamino group; and leuco triphenylamine dyes or various salts (e.g., HCl salts) thereof. Representative materials include N-phenylglycerine, acetoacetanilide, 4-acetamidothiophenol, 2-mercaptobenzimidazole, and others that appear in the Examples hereinafter, as well as the extensive lists of specific compounds that appear in the two patents just mentioned.

The two free-radical-producing agents are carefully chosen to be responsive to different wavelengths of actinic radiation and to stimulate different levels of free-radical-generating activity in the hydrogen-donor compound. The first free-radical-generating agent, i.e., the one that will be activated during the first, imagewise exposure, should stimulate the hydrogen-donor compound only to the extent that the free radicals thereby produced will be exhausted by the presence of a gaseous polymerization inhibitor before any substantial polymerization of the monomer can occur. In other words, the combination of the first free-radical-generating agent and the hydrogen-donor compound should constitute a relatively slow photoinitiator system. Particularly useful for the first free-radical-generating agent are the photoreducible dyes, such as those described, for example, in U.S. Pat. Nos. 2,850,445 and 2,875,047, and mentioned at column 8, lines 43 ff. of the aforementioned U.S. Pat. No. 3,418,118. These dyes are suitable because they stimulate a relatively low response in the hydrogen-donor compound, and, because in general they respond to actinic radiation in the visible region, their activity can conveniently be kept separated from that of other agents whose peak response is to non-visible radiation. Typical of the useful photo-reducible dyes are Methylene Blue (C.I. 52015) and Erythrosin B (C.I. 45430), but it is to be understood that the scope of the invention is not limited to the use of these two specific materials.

The second free-radical-generating agent should be one that, on exposure to suitable actinic radiation, activates the hydrogen-donor compound to a degree that polymerization of the monomer is caused to occur despite the presence of a gaseous polymerization inhibitor, i.e., the second free-radical-generating agent and the hydrogen-donor compound should together constitute a relatively fast photoinitiator system. With some of the more rapid agents, it is possible that two simultaneous mechanisms may occur, one involving initiation of polymerization directly by the activated second free-radical-generating agent alone and one involving the serial action of that agent and the hydrogen-donor compound. In any event, for the successful operation of the invention, the total number of free radicals produced and the rate of their production must be sufficient to exceed the rate at which the free radicals are exhausted by the gaseous polymerization inhibitor, so that there are excess free radicals available to initiate polymerization of the monomer.

Many of the more active free-radical-generating agents are stimulated to peak activity by ultraviolet radiation, and are thereby conveniently distinguished from the slower agents activatable by visible light that are, therefore, useful as the first free-radical-generating agent. For the second, more rapid free-radical-generating agent there may be used any of a large number of compounds known in the art. A number of useful materials, although some of them may be thermally active at temperatures as low as 85° C., are described in Plambeck, U.S. Pat. No. 2,760,863, and include vicinal ketaldonyl compounds, e.g., diacetyl, benzil; α-ketaldonyl alcohols, e.g., benzoin, pivaloin; acyloin ethers, e.g., benzoin methyl and ethyl ethers; α-hydrocarbon-substituted aromatic acyloins, e.g., α-methyl-benzoin, α-allylbenzoin, α-phenylbenzoin. A more preferred class of photoinitiators, thermally inactive at and below 185° C., are the substituted or unsubstituted polynuclear quinones having two intracyclic carbonyl groups attached to intracyclic carbon atoms in a conjugated carbocyclic ring system, a number of which are disclosed at col. 2, 11. 8 ff. of Notley, U.S. Pat. No. 2,951,758. Still more preferred, particularly because they impart high speed to the photosensitive composition, are the dimers described at column 4, lines 32–50 of Chambers, U.S. Pat. No. 3,479,185, and in particular the 2,4,5-triphenyl-imidazolyl dimers consisting of two lophine radicals bound together by a single covalent bond, and more especially such dimers having an ortho substituent on the 2-phenyl ring. The lophine dimers may also be used advantageously with hydrogen-donor compounds of the Michler's ketone type as disclosed in Chang and Fan, U.S. Pat. No. 3,549,367.

If desired, the photosensitive compositions for this invention may also include chain transfer agents or polymerization accelerators, such as one or more of the agents disclosed in Barney et al., U.S. Pat. No. 3,046,127, in the amounts given in that patent, and may also contain thermal polymerization inhibitors such as those mentioned in Webers, U.S. Pat. No. 3,380,825, at Col. 8, lines 39–49.

As previously indicated, the several components of the photosensitive compositions will ordinarily be mixed together in a material that is a solvent for all of the components. The particular solvent used is not critical; it merely affords a practical method of obtaining coatings or self-supporting films of the compositions. Representative of solvents that may be used, but in no way limiting, are 2-propanone, 2-butanone, 3-pentanone, 1,2-dichloroethane, methyl acetate, dichloromethane, trichloromethane, and ethyl acetate.

For convenience in handling, the photopolymerizable composition is preferably coated on a sheet support. Suitable materials include films composed of high polymers such as polyamides, e.g., polyhexamethylene sebacamide, polyhexamethylene adipamide; polyolefins, e.g., polyethylene; polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. Where the particular application does not require that the base support be transparent, the photopolymerizable composition may usefully be coated on an opaque support, such as paper, especially water-proof photographic paper; thin materal sheets, especially aluminum and copper sheets; cardboard; and the like. The support used, of whatever type, may also have in or on its surface and beneath the photopolymerizable stratum an antihalation layer or other substrate needed to facilitate anchorage of the photopolymerizable stratum to the base. The manner of coating the photosensitive compositon on a base or of casting it to form a self-supporting film is not critical; these operations are readily performed by procedures well known to those skilled in the art.

Even after evaporation of the solvent, many of the photosensitive coatings or self-supporting films made from the various components outlined above are somewhat soft, sticky, or tacky. To facilitate storage and handling, it may frequently be desirable to apply a cover layer, which may be either an additional coating or a previously cast film. A convenient and suitable material is any of the several commercially available varieties of polyethylene film. Alternatively, any of a number of readily soluble polymeric materials, e.g., cellulose acetate, may be coated in solution over the photosensitive stratum to leave, after removal of solvent, a hard, dry, non-tacky surface. Depending on the degree of tackiness on the photosensitive stratum, the protective layer may be left in place during exposure or not, as desired. If it is to be left in place, the material selected should have good clarity and it must be permeable to the gaseous polymerization inhibitor, which must have adequate access to the photopolymerizable composition during the first, imagewise exposure.

In carrying out the process of this invention, a photosensitive layer is prepared as already described. The layer may include a polymeric binder, an ethylenically unsaturated monomer, a hydrogen-donor compound, and two free-radical-generating agents. In a preferred embodiment, the first free-radical-generating agent will be a photoreducible dye with a relatively low activatability by visible actinic radiation of any wavelength greater than 450 nm. The second free-radical-generating agent will be essentially non-responsive to visible light but will have a relatively high response to ultraviolet radiation. The layer is given a first imagewise exposure, e.g., through a process transparency by conventional contact-printing or projection techniques, to actinic radiation of wavelength suitable to the photoreducible dye employed as the first free-radical-generating agent.

During this imagewise exposure step, the photopolymerizable composition is freely accessible to a gaseous polymerization inhibitor. Atmospheric oxygen is a convenient and preferred inhibitor for use in this step, but other gaseous or volatile inhibitors may also be employed, e.g., sulfur dioxide, iodine, nitric oxide, formaldehyde, p-nitrosodimethylaniline, or hydrogen sulfide. In this exposure step, the actinic radiation activates the photoreducible dye, and the activated state of the dye in turn stimulates the hydrogen-donor compound to produce free radicals. The intensity of the exposure is controlled such that the rate of generation of free radicals does not exceed the rate of diffusion of the gaseous polymerization inhibitor into the composition. The gaseous polymerization inhibitor reacts with the free radicals, neutralizing them and preventing them from initiating polymerization of the monomer. The duration of the exposure is controlled such that this series of reactions is allowed to go to completion in the areas exposed to the actinic radiation. In this way, the hydrogen-donor compound in the exposed areas is exhausted without any substantial amount of polymerization having occurred. However, if the rate of generation of free radicals were to exceed the rate of diffusion of inhibitor into the composition, it would be the inhibitor rather than the hydrogen-donor compound that would be exhausted and it would then be possible for unwanted polymerization to occur. In this respect, the appropriate range of concentration of photoinitiator components and exposure conditions must be selected.

The layer is then given an overall, nonimagewise exposure to actinic radiation suitable to the second free-radical-generating agent, i.e., in the most preferred embodiment, to ultraviolet radiation. By the selection of a relatively "fast" second free-radical-generating agent and a suitably intense exposure, the rate of generation of free radicals will be caused to be sufficiently high to exceed the rate of diffusion of the gaseous polymerization inhibitor into the composition. In this way, although the inhibitor may neutralize and exhaust some of the free radicals, there will be a sufficient excess concentration of free radicals to initiate polymerization of the monomer in all the areas not exposed in the first, imagewise exposure step. The areas exposed in the first step will not polymerize because the hydrogen-donor compound in those areas was exhausted by the inhibitor during the first exposure step. Thus, the polymerized image formed in the layer is a reverse image that is a true copy of the original, because the areas finally polymerized are those not exposed in the first, imagewise exposure, i.e., those that correspond to the dark or opaque areas of the original. The second exposure period may be sufficiently long to allow completion of polymerization while the layer is exposed to the actinic radiation, or it may be only long enough to initiate the polymerization reaction, whereupon the layer may be heated to complete polymerization.

Upon completion of exposure and optional subsequent heating to complete polymerization, the image in the layer can be developed in any of a number of ways known in the art. These techniques include solvent wash-out of unpolymerized material, thermal transfer of the unpolymerized portions to a receptor sheet, dusting or toning with dyes or pigments that adhere to the tacky unpolymerized areas but not to the photohardened areas, differential adhesion of unpolymerized and photohardened areas, diffusion of dyes into or through the layer, and the like, the method in a given instance depending on the use to which the layer is to be put or the nature of the final image or copies desired. For example, if it is desired to make multiple final copies that are true copies of the original, the non-photohardened material can be removed from the element by solvent wash-out, and the element with the photohardened material remaining can be used as either a relief or planographic printing plate. Alternatively, copies that are inversions of the original can be made by employing the non-photohardened portion of the reverse image in known thermal transfer and/or toning procedures. Other applications may not require removal of the non-photohardened material, e.g., read-out of the photohardened image may be effected by Schlieren optics, or the image may be both recorded and read out by holographic techniques using lasers or other coherent light sources of different wavelengths.

The invention will be further illustrated by, but is not intended to be limited to, the following examples, wherein parts and percentages are by weight unless otherwise noted.

EXAMPLE I

The following ingredients were mixed by conventional laboratory procedures:

| | |
|---|---|
| a. Acetone | 95 ml |
| b. Cellulose acetate butyrate (ca. 17% butyryl, ca. 29.5% acetyl, and ca. 1.5% hydroxyl; viscosity of 38-81 poises as determined by ASTM Method D-1343-54T in solution described as Formula A, ASTM Method D-871054T) | 10.5 g |
| c. Triethyleneglycol diacrylate | 10.5 g |
| d. 2-o-Chlorophenyl-4,5-di(m-methoxyphenyl)-imidazolyl dimer | 1.30 g |
| e. Tris[4-diethylamino-2-methylphenyl]-methane | 0.50 g |
| f. p-Toluene sulfonic acid | 0.50 g |

To a 10 g sample of this solution, there was then added:

| | |
|---|---|
| g. N-Phenylglycine (as solution of 500 mg in 50 ml ethanol) | 5 mg |
| h. 7-Diethylamino-4-methylcoumarin | 100 mg |
| i. Methylene Blue (C.I. 52015) (as solution of 500 mg in 50 ml ethanol) | 2 mg |

After thorough mixing, a portion of the photopolymerizable composition thus formed was coated by means of a doctor knife set at a clearance of 0.006 inch on a 0.002-inch-thick polyethylene terephthalate film. The coating was air-dried for 30 minutes to permit evaporation of solvent, and a sheet of 0.001-inch-thick polyethylene terephthalate film was then applied by hand over the tacky coating surface.

The photosensitive layer prepared in this way was given an imagewise exposure through a stepwedge. The exposure was for 3 minutes at a distance of 8 inches from a 275-watt sunlamp, through a yellow filter (Kodak Wratten K-3) transmitting only light of wavelength greater than 450 nm. The stepwedge and filter were removed and the photosensitive layer was given an overall exposure of two seconds to the unfiltered light of the same sunlamp, again at a distance of 8 inches. After removal of the cover sheet, the layer was washed with tetrachloroethylene/2-butanol (50/50) to remove unpolymerized material and leave a positive relief image that was a true copy of the stepwedge.

In this Example, the hydrogen-donor compound was N-phenylglycine and the first free-radical-generating agent was Methylene Blue. Exposure of this combination of agents to the yellow light resulted in generation of free radicals in the areas of the layer corresponding to the transparent portions of the stepwedge. However, since the exposure was not made while the layer was in a vacuum frame, these free radicals did not initiate polymerization of the monomer but instead were consumed by the oxygen present in the layer, including that present as the composition was originally made and the limited amount able to diffuse into the layer from the atmosphere through the thin polyethylene terephthalate cover sheet. The intensity and duration of the exposure were sufficient to exhaust the hydrogen-donor compound in the areas struck by the yellow light.

In the second exposure step, the hydrogen-donor compound was again N-phenylglycine, and the second free-radical-generating agent was component (d), the imidazolyl dimer. This combination comprised a fast photoinitiator system, responsive to the substantial ultraviolet radiation of the unfiltered sunlamp. Even the brief duration of the second exposure step was enough to cause generation of free radicals at a rate sufficient to initiate polymerization of the monomer despite the presence and inhibiting effect of oxygen. Because the hydrogen-donor compound had already been exhausted in the areas struck by yellow light in the first step, polymerization could be induced in the second step only in those areas corresponding to the dark or opaque areas of the stepwedge.

Components (e), (f), and (h) constituted primarily a color-forming system, not essential to this invention. Because they were included, the final polymerized reverse image in the photosensitive layer was colored a deep blue and was readily visible. While this alternate read-out method may be useful, it is not necessary in some applications that the polymerized image itself be visible, although it may be convenient if it is so. In addition to their color-forming function, components (e) and (h) are also useful hydrogen-donor compounds, and it may be considered that they also operated in this capacity to further the polymerization reaction.

The remaining portion of the photopolymerizable composition was coated (doctor knife clearance of 0.006 inch) on an aluminum plate, air-dried, and covered with a sheet of 0.001-inch-thick polyethylene terephthalate film. The element thus prepared was given a first, imagewise exposure through a process transparency and a second, nonimagewise exposure according to the exposure conditions described above. The cover sheet was removed and unpolymerized material was washed off with tetrachloroethylene/2-butanol (50/50) to leave on the aluminum plate a positive relief photopolymer image that was a true copy of the process transparency. The image-bearing aluminum plate was mounted on an offset printing press, and a number of copies was printed on bond paper. The printed copies were good positive copies of the original positive process transparency.

EXAMPLES II–V

A solution of the following ingredients was prepared:

| | |
|---|---|
| a. Acetone | 10 ml |
| b. Trichloroethylene | 41.5 ml |
| c. Poly(methyl methacrylate) [Inherent viscosity=0.20 for a solution of 0.25 g polymer in 50 ml chloroform as measured at 20°C. with a No. 50 Cannon-Fenske Viscometer] | 4.425 g |
| d. Poly(methyl methacrylate) [Inherent viscosity=1.20, measured as described for (c)] | 1.465 g |
| e. Imidazolyl dimer of Example I | 0.45 g |
| f. Tris[4-diethylamino-2-methyl-phenyl]-methane | 0.20 g |
| g. p-Toluene sulfonic acid | 0.15 g |
| h. Triethyleneglycol diacrylate | 4.0 ml |

After thorough mixing, four 1-gram portions of this solution were separately taken, and additions were made as indicated in Table 1, each of the additional components being introduced in the form of a 10-mg/ml solution in ethanol, in the amount required to give the weight shown:

TABLE 1

| Example | Erythrosin B (C.I. 45430) | N-phenylglycine |
|---|---|---|
| II | 1 mg | None |
| III | 3 mg | None |
| IV | 1 mg | 2 mg |
| V | 3 mg | 2 mg |

Each of the compositions so prepared was spread with a doctor knife set at 0.006 inch on 0.002-inch-thick polyethylene terephthalate film. After air-drying to remove solvent, the photosensitive layers were covered with a transparent 0.001-inch-thick sheet of polypropylene film. Each sample was then imagewise exposed, through a stepwedge or a process transparency, for 4 minutes at a distance of 7.5 inches from a 275-watt sunlamp through a yellow filter (Kodak Wratten K-2), then given an overall exposure at the same distance for two sections to the unfiltered light of the same sunlamp, and heated for about three seconds on the lamp housing. In all cases, positive-working photopolymer images were produced in the photosensitive layers, and they were converted to positive relief images when the layers were washed with tetrachloroethylene/2-butanol (50/50).

These four examples were repeated, except that the compositions were coated on aluminum plates rather than on polyethylene terephthalate film. The four elements thus prepared were given first, imagewise exposures through process transparencies and second, nonimagewise exposures, both exposures being under the conditions just described. After heating, removal of the cover sheets, and solvent wash to remove unpolymerized material, the image-bearing aluminum plates were mounted on an offset press and used for printing a number of bond-paper copies that were good, positive copies of the original process transparencies.

In all of these Examples, the first free-radical-generating agent was Erythrosin B and the second free-radical-generating agent was the imidazolyl dimer. The hydrogen-donor compound in Examples II and III was the dialkylamino-substituted triphenylmethane dye, and in Examples IV and V it was primarily the more active N-phenylglycine. In all of the Examples, the leuco dye and the p-toluene sulfonic acid also cooperated to produce blue color in the photopolymer image.

EXAMPLES VI–VII

A composition like the preliminary solution of Example II was made up, i.e., ingredients (a) through (h). Three 15-gram portions of this solution were taken for further handling as follows:

Example VI — Addition of 3 mg of Erythrosin B (as 10 mg/ml solution in ethanol), followed by coating with 0.006-inch doctor knife setting on 0.001-inch-thick polypropylene film.

Example VII — Addition of 6 mg Erythrosin B (as before), followed by coating on polypropylene as for Example VI.

Control A- Addition of 10 mg Erythrosin B (as before), followed by coating with 0.006-inch doctor knife setting on 0.002-inch-think polyethylene terephthalate film.

After drying, each of the coated films was laminated to a sheet of commercially available circuit board material comprising a 0.001-inch-thick coating of copper on a phenolic backing. The coated side was placed against the copper surface, such that the transparent substrate then became the protective top layer of the laminated structure. Each of the layers was then given an imagewise exposure through a positive transparency representing a printed circuit pattern. This exposure was for 8 minutes at a distance of 8 inches from a 500watt photoflood lamp having little or none of its output at wavelengths less than 450 nm. Examples VI and VII were then given nonimagewise exposures for periods of 30 to 120 seconds at a distance of 16 inches from the unfiltered sunlamp of the preceding examples, i.e., to radiation of less than 450 nm wavelength, then heated for 15 seconds at 120° C. in an oven. When the polypropylene cover sheets were removed and the layers were given the solvent wash-out development of Example I, positive relief photopolymer images of the circuit pattern remained.

Control A, with a cover sheet substantially impermeable to atmospheric oxygen, was not given the second, overall exposure. Instead, after the first exposure step, the cover sheet was removed and the layer given the same development as the other samples, to leave a negative relief photopolymer image of the circuit pattern. Thus, the exclusion of oxygen during the imagewise exposure led to a negative-working system, contrary to the process of this invention, wherein the presence of a polymerization inhibitor in the first exposure stage is required for a positive-working or reverse-image system.

Examples VI and VII show the ready application of this invention to a positive-working system for the production of printed circuits. After solvent wash-out as described, the boards were etched by soaking overnight at room temperature in a saturated solution of $FeCl_3$ in HCl to remove copper from areas not protected by the photohardened image, then water-rinsed. The photopolymer image was then removed by scrubbing with trichloroethylene to reveal the remaining copper in the form of a circuit positively reproducing the pattern of the original process transparency.

EXAMPLES VIII–XVI

These Examples illustrate other ingredients and compositions useful in the practice of this invention. Each of the compositions contained:

| | |
|---|---|
| a. Trichloroethylene | 13 ml |
| b. Acetone | 3 ml |
| c. Poly(methyl methacrylate) [Component (c) of Example II] | 1.3 g |
| d. Poly(methyl methacrylate) [Component (d) of Example II] | 0.5 g |
| e. Triethylene glycol diacrylate | 1.15 ml |

to which were added the other components and amounts thereof indicated in Table 2. Each of the compositions was coated at 0.006-inch doctor knife clearance on 0.002-inch-thick poly-ethylene terephthalate film, air-dried for 30 minutes, then covered with a sheet of 0.001-inch-thick polyethylene film.

For each composition, the first, imagewise exposure through a process transparency was to a 500-watt photoflood lamp through a yellow filter that transmitted effectively no radiation below 480 nm, for the time shown in Table 2, at such a distance that the unfiltered light from the lamp gave a reading equivalent to an exposure value of 11 when measured against white paper by a CdS-type exposure meter (Gossens Super Pilot) set at ASA 50.

The second, nonimagewise exposure for each composition was to an unfiltered 275-watt sunlamp for the time shown in Table 2 and at a distance that gave a light meter reading equivalent to an exposure value of 10 when measured as just described.

After exposure, the polyethylene cover sheet was removed and the layer was scrubbed with methylchloroform to reveal in every case a positive image that was a true copy of the original process transparency. It will be understood that the same compositions and procedures can be used to make offset printing plates and circuit boards when the compositions are coated on the appropriate substrates rather than on the polyethylene terephthalate film of these examples. It will further be understood by those skilled in the art that other development and read-out procedures can also be employed. It will also be understood that the polyethylene cover sheet is permeable to atmospheric oxygen, so that the photosensitive layer was accessible to this gaseous polymerization inhibitor during both exposure steps.

In Table 2, the first and second free-radical-generating agents, which coact with the hydrogen -donor compound in the imagewise and nonimagewise exposure steps respectively, are for brevity identified simply as "Agent" in connection with the two exposure steps.

TABLE 2

| Example | Hydrogen-Donor 15 mg* | First Exposure Agent and Amount (mg) | | Time min. | Second Exposure Agent (100 mg) | Time sec. |
|---|---|---|---|---|---|---|
| VIII | N-Phenylglycine | Methylene Blue | (2) | 10 | Lophine dimer** | 11 |
| IX | do. | do. | (15) | 10 | do. | 10 |
| X | do. | do. | (45) | 10 | do. | 30 |
| XI | 2-Mercapto-benzimidazole | Erythrosin B | (10) | 10 | do. | 15 |
| XII | N-Phenylglycine | Methylene Blue | (15) | 10 | Benzoin methyl ether | 120 |
| XIII | do. | do. | (45) | 5 | do. | 120 |
| XIV | 2-Mercapto-benzimidazole | Erythrosin B | (10) | 10 | do. | 40 |
| XV | N-Phenylglycine | Methylene Blue | (15) | 10 | 2-t-Butylanthraquinone | 60 |
| XVI | do. | do. | (45) | 10 | do. | 60 |

* All 15 mg except Example VIII = 30 mg

** 2-o-Chlorophenyl-4,5-diphenylimidazolyl dimer

EXAMPLES XVII–XIX

These three Examples resemble the immediately preceding series, with differences in the binder and in the amounts and kinds of some of the other components. All three employed the following:

| | |
|---|---|
| a. Trichloroethylene | 13 ml |
| b. Acetone | 3 ml |
| c. Cellulose acetate butyrate of Example I | 1.3 g |
| d. Triethyleneglycol diacrylate | 1.3 ml |
| e. Erythrosin B | 12 mg |
| f. 2-o-Chlorophenyl-4,5-diphenyl-imidazolyl dimer | 150 mg |
| g. Hydrogen-donor compound (see Table 3) | 15 mg |

Mixing, coating, exposure and development were all carried out as for Example VIII. In each case, a reverse image of the original process transparency was obtained in the photohardenable layer. The hydrogen-donor compounds and exposure times were as shown in Table 3.

TABLE 3

| Example | Hydrogen-Donor | Exposure Times First, min. | Exposure Times Second, sec. |
|---|---|---|---|
| XVII | Tris[4-diethylamino-2-methyphenyl]methane | 15 | 15 |
| XVIII | 5-5-Dimethyl-1,3-cyclohexanedione | 10 | 15 |
| XIX | N-Phenylglycine | 10 | 30 |

EXAMPLES XX–XXXII

These Examples were carried out by the procedures of Example VIII and used the same components (a), (b), (c), and (d) as Example VIII in the same amounts. As monomer, there was used 1.5 ml of trimethylolpropane triacrylate. Other components and amounts and exposure times are shown in a Table 4. Reverse images of the original process transparency were obtained in every case.

TABLE 4

| | Hydrogen-Donor 15 mg | First Exposure Agent and Amount (mg) | | Time, min. | Second Exposure Agent (100 mg) | Time, sec. |
|---|---|---|---|---|---|---|
| | N-Phenylglycine | Methylene Blue | (10) | 10 | Lophine dimer* | 30 |
| | do. | Erythrosin B | (10) | 10 | do. | 15 |
| | Tris[4-diethylamino-2-methylphenyl]-methane | do. | (10) | 20 | do. | 40 |
| | 5,5-Dimethyl-1,3-cyclohexanedione | do. | (10) | 20 | do. | 40 |
| XXIV | N-Cyclohexyl-2-benzothiazole sulfenamide | do. | (10) | 20 | do. | 30 |
| XXV | 2-Mercaptobenzimidazole | do. | (10) | 15 | do. | 15 |
| XXVI | Tris[4-diethylamino-2-methylphenyl]-methane | Methylene Blue | (10) | 20 | do. | 60 |
| XXVII | 5,5-Dimethyl-1,3-cyclohexanedione | do. | (10) | 20 | do. | 45 |
| XXVIII | 4-Acetamidothiophenol | do. | (10) | 15 | do. | 45 |
| XXIX | Acetoacetanilide | do. | (10) | 20 | do. | 45 |
| XXX | N-Phenylglycine | do. | (10) | 10 | Benzoin methyl ether | 180 |
| XXXI | do. | do. | (10) | 10 | 2-t-Butylanthraquinone | 180 |
| XXXII | do. | Erythrosin B | (10) | 10 | do. | 180 |

* 2-o-Chlorophenyl-4,5-diphenylimidazolyl dimer

From the foregoing, it will be seen that the present invention provides a positive-working, reverse-image photopolymer imaging system that has advantages in simplicity, convenience, economy and image quality over prior art methods of producing reverse images in photopolymers. The invention can be carried out with a wide variety of readily available and inexpensive materials, and it permits great flexibility in development or read-out methods, such that, depending on the particular use, the final copies produced may be true or inverse copies of the original. The invention can find application in a variety of graphic arts and related manufacturing operations such as the production of relief or planographic printing plates, the making of positive proofs from positive transparencies, the preparation of reverse copies by thermal transfer and toning techniques, the manufacture of etched printed circuit boards, and the like.

I claim:

1. A process for producing a reverse image on a photosensitive element having a layer containing (a) an ethylenically unsaturated, addition-polymerizable or crosslinkable material, (b) a hydrogen-donor compound capable of initiating polymerization or crosslinking of said material, and (c) first and second free radical generating compounds capable of activating said hydrogen-donor compound on exposure to radiation of different wavelengths, the process having the steps of 1. imagewise exposing said layer to radiation of wavelengths at which only said first free radical generating compound is capable of activating said hydrogen-donor compound, in the presence of a gaseous polymerization inhibitor that exhuasts said hydrogen-donor compound and prevents photohardening in the exposed areas, said step of imagewise exposing being carried out until the exposed areas are not capable of being polymerized by further exposure to radiation, and
2. nonimagewise exposing said layer to radiation, said radiation including wavelengths different than those of the radiation used in the step of imagewise exposing and capable of photohardening, in the presence of said inhibitor, the areas that were not exposed in the imagewise exposure.

2. A process of claim 1 having the additional step of heating the layer to complete polymerization of the areas of the layer that were not exposed in the imagewise exposure.

3. A process of claim 1 wherein said first free radical generating compound is responsive to radiation of wavelengths greater than 450 nm and said second free radical generating compound is responsive only to radiation of wavelengths less than 450 nm, the step of imagewise exposing being carried out with radiation of wavelengths greater than 450 nm and the step of nonimagewise exposing being carried out with radiation including wavelengths of less than 450 nm.

4. A process of claim 1 wherein said photosensitive element comprises a sheet support bearing said layer.

5. A process of claim 1 wherein said step of imagewise exposing comprises exposing said layer to image light from a light source emitting radiation of wavelengths both greater and less than 450 nm, the radiation from said light source being filtered through a filter that passes only radiation of wavelengths greater than 450 nm, said step of nonimagewise exposing being carried out without said filter.

6. A process of claim 1, wherein said ethylenically unsaturated, addition-polymerizable or crosslinkable material is triethyleneglycol diacrylate or trimethylolpropane triacrylate.

7. A process of claim 1, wherein said hydrogen-donor compound is N-phenylglycine or 2-mercaptobenzimidazole.

8. A process of claim 1, wherein said first free radical generating compound is Erythrosin B or Methylene Blue and said second free radical generating compound is 2-o-chloro-phenyl-4,5-di(m-methoxyphenyl-)imidazolyl dimer or benzoin methyl ether.

9. A process of claim 1, said layer containing a binder of cellulose acetate butyrate or poly(methyl methacrylate).

10. A process of claim 1, said step of nonimagewise exposure being carried out in the presence of a photohardening inhibitor.

11. A process of claim 10, said photohardening inhibitor being atmospheric oxygen.

* * * * *